United States Patent [19]

Katoh

[11] Patent Number: 4,806,456

[45] Date of Patent: Feb. 21, 1989

[54] DRY DEVELOPMENT METHOD FOR A RESIST FILM AND AN APPARATUS THEREFOR

[75] Inventor: Shinya Katoh, Tokyo, Japan

[73] Assignee: Fujitsu Limited, Kanagawa, Japan

[21] Appl. No.: 147,590

[22] Filed: Jan. 21, 1988

Related U.S. Application Data

[63] Continuation of Ser. No. 843,350, Mar. 24, 1986, abandoned.

[30] Foreign Application Priority Data

Mar. 29, 1985 [JP] Japan .................. 60-68286

[51] Int. Cl.[4] .............................................. G03C 5/16
[52] U.S. Cl. ..................... 430/296; 430/325;
430/328; 430/394; 430/942; 250/492.3
[58] Field of Search ............... 430/296, 325, 328, 942,
430/394; 250/492.3

[56] References Cited

U.S. PATENT DOCUMENTS 4,403,151 9/1983 Mochiji et al. ............. 250/492.2
4,414,059 11/1983 Blum et al. ................. 156/659.1
4,612,267 9/1986 Heitmann et al. ............ 430/3

FOREIGN PATENT DOCUMENTS 1181114 2/1970 United Kingdom .

OTHER PUBLICATIONS

Mochiji et al., "Negative Patterning of AZ1350J by Electron–Beam Desensitization . . . ", Japanese J. Appl. Physics, vol. 20, 1981, pp. 63-67.
Sugita et al., "Dry Etching of Polymer Coatings by Deep-UV Irradiation", Photographic Sci. and Eng., vol. 20(4), Jul./Aug. 1983, p. 146.
IBM Technical Disclosure Bulletin, vol. 19, No. 1, Jun. 1976, p. 316.
Patent Abstracts of Japan, vol. 9, No. 169, (E-328) [1892], 13th Jul. 1985.
Patent Abstracts of Japan, vol. 6, No. 151, (E-124) [1029], 11th Aug. 1982.
Patent Abstracts of Japan, vol. 7, No. 87, (P-190) [1232], 12th Apr. 1983.
IBM Technical Disclosure Bulletin, vol. 26, No. 6, Nov. 1983, p. 301.

Primary Examiner—José G. Dees
Attorney, Agent, or Firm—Armstrong, Nikaido, Marmelstein & Kubovcik

[57] ABSTRACT

A negative type electron beam sensitive resist film of CMS (chloro-methyl poly-styrene) is developed in a dry environment without using a vacuum system. The resist film is selectively exposed to an electron beam to form a latent image of a desired pattern therein and, then, subjected to irradiation by deep UV having a spectral component of 2537 Å or shorter in an oxidizing gas such as atmospheric air. The average thickness decrease speeds during the dry development are 12 Å/min and 300 Å/min respectively for the portions exposed and unexposed to the electron beam, revealing a contrast ratio of 100 to 4 in terms of the remaining resist film thickness. A film of PGMA (poly-glycidyl metha-acrylate), and other negative type electron beam sensitive resists, may also be developed by the same method.

9 Claims, 3 Drawing Sheets

DRY DEVELOPMENT METHOD FOR A RESIST FILM AND AN APPARATUS THEREFOR This application is a continuation of application Ser. No. 843,350, filed Mar. 24, 1986, now abandoned.

BACKGROUND OF THE INVENTION

The present invention relates to a method for developing a resist film, more specifically to a dry development method for generating a desired pattern of a resist film on a substrate.

In the manufacturing of a semiconductor circuit, a wet process is generally employed for the development of a resist film formed on a substrate such as a silicon wafer. For instance, chloro-methyl polystyrene (CMS), which is widely used as a high resolution and high contrast negative type resist for electron beam lithography, is developed by an organic solution composed of iso-amyl acetate and ethyl cellosolve or of acetone and iso-propyl alcohol.

However, the wet development process for resist films usually involves the following problems: precise controls are required for the temperature and concentration of the developing solution (developer); and contamination of the substrate can occur from a residue mainly consisting of the removed resist which is dissolved in the developer or in the rinsing solution.

Negative type resist films generally have another problem relating to the tendency of swelling thereof when soaked in developing solutions such as an organic solution. The swelling is apt to leave a scum at the edge of the remaining resist film which results in the low resolution of the resist pattern as compared with the resolution achieved by using positive type resist films.

The above mentioned problems in the wet development also apply to the conventional photoresists, more or less, however, they are more serious for the resist films used in the electron beam lithography which is becoming indispensable to the modern VLSI trend requiring patterns of submicron dimensions.

The above problems in the wet development of resist films can be eliminated if a dry method is made practical for the development of resist films. Although several dry processes have been incorporated in the manufacturing of VLSI semiconductor circuits, it seems that there are only a few disclosures concerning dry development of resist films, including one utilizing an oxygen plasma for developing a negative photo-resist film. (J. N. Smith et al. "A Production Viable Plasma Developable Photoresist" Semiconductor International, December 1979.)

However, the above described dry development requires expensive equipment for producing the plasma, including a vacuum chamber and pumping system, a gas-introducing system for oxygen and a radio-frequency power supply system. Further, these systems require complicated and time consuming steps for controlling the process. Therefore, it is desired to provided a cost-effective dry development method that can be carried out in atmospheric air without involving any complicated process control. Further, the dry development method must be applicable to an electron beam resist.

SUMMARY OF THE INVENTION

It is, therefore, an object of the present invention to provide a dry development method which can be carried out easily and cost-effectively.

It is another object of the present invention to provide a dry development method applicable to an electron beam resist film.

The above objects can be attained by a dry development process wherein an electron beam sensitive resist film is formed on a substrate such as a silicon wafer. The resist film is subject to a selective irradiation by an electron beam for creating therein a latent image of a desired pattern, and then, to a deep UV exposure in an oxidizing gas for selectively removing the film according to the image. More specifically, if the resist is a negative type, the portions not irradiated by the electron beam are removed during the deep UV exposure while the portions irradiated by the electron beam are left on the substrate so as to generate the desired pattern of the resist film. The remainder of the resist film pattern is used as the mask in a subsequent conventional process.

As an exemplary negative type resist film, a chloro-methyl polystyrene (CMS) film has been used in the dry development according to the present invention. The deep UV interacts with oxygen in the oxidizing gas such as air and generates ozone and oxygen radicals. When receiving the attack of the ozone and oxygen radicals, the unexposed portion of the resist film is converted into volatile substances including CO, $CO_2$ and $H_2O$ and is thus removed from the substrate. The dry development performed in an atmospheric environment allows the substrate to be free from the problems of the contamination by the developer and of the precise process control in the wet development. Further, the dry development method eliminates the needs for a vacuum chamber, gas-introducing system and radio-frequency power source required in the aforesaid dry developing method using an oxygen plasma.

DESCRIPTION OF PREFERRED EMBODIMENTS

Figure 1:
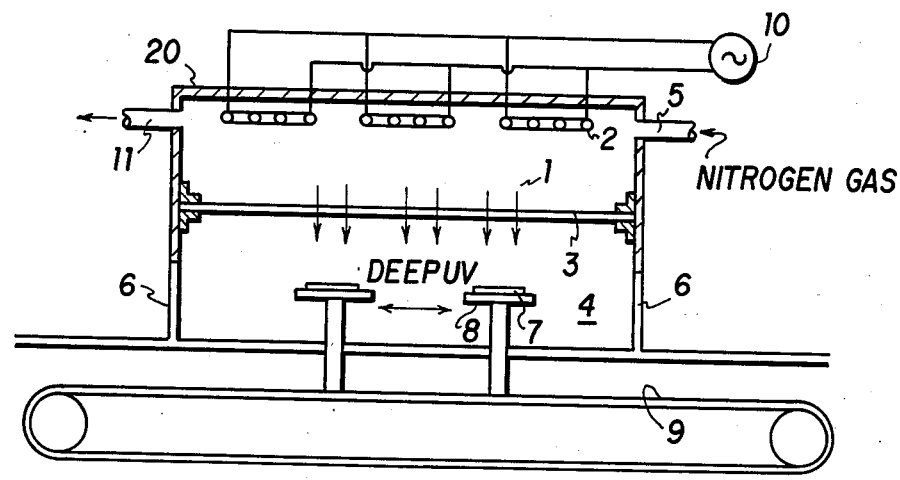
FIG. 1 is a schematic cross-section of an apparatus employed for the dry development method of the present invention.

FIG. 1 is a schematic cross-section of a preferred embodiment of the apparatus employed for the dry development method of the present invention.

Referring to FIG. 1, a chamber 20 formed from stainless steel and having a height of 500 mm, width of 400 mm and length of 700 mm, for example, is partitioned into a UV generating space 1 and a work space 4 by a quartz plate 3. The UV generating space 1 is provided with UV sources 2 such as low-pressure mercury lamps utilizing a discharge of mercury vapor and xenon, each of which has an input power of about 100 watts and is energized by an external power source 10 for providing a deep UV irradiation intensity of 20 mW/cm$^2$. The UV sources 2 provide a deep UV radiation including wave-length components 1849Å and 2537Å, which is applied to the work space 4 through the quartz plate 3. In FIG. 1, three UV sources 2 are illustrated, as an example.

Quartz has a sufficient transmission characteristic for the deep UV, thereby allowing efficient use of the UV. The UV generating space 1 is further provided with an inlet port 5 and an outlet port 11 for supplying the flow of a coolant gas such as nitrogen for the UV sources 2. The chamber 20 is provided with respective gate portions 6 at both sides of the work space 4, for allowing each table 8 for supporting a substrate 7 such as a silicon wafer to pass in and out of the space 4 in accordance with the movement of a belt conveyer 9. The chamber 20 also has the function of a shield for preventing operators or instruments positioned in the vicinity thereof from being damaged by the strong deep UV irradiation. The work space 4 is open to atmospheric air, and thus the process control therefor is easier as compared with that in the prior art dry development using a vacuum chamber.

The substrates 7 such as silicon wafers, each having a resist film formed thereon, are subjected to the deep UV irradiation while passing through the work space 4. The resist film on each substrate 7, which has a latent image of a desired pattern generated therein in advance by a selective exposure to an electron beam, is developed by the deep UV irradiation in an oxidizing gas such as air. The development of the resist film is performed according to the differential reaction rates between the respective portions thereof which were subjected to and which were not subjected to the electron beam exposure.

The deep UV of 2537Å transmitted through the quartz plate 3 reacts with the oxygen in the atmospheric air, for example, in the work space 4 and produces ozone ($O_3$).

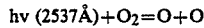

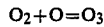

The ozone, $O_3$, having strong oxidizing power causes an oxidation reaction with the resist film as follows:

$$O_3 + C_nH_mO_k = CO + CO_2 + H_2O \quad (1)$$

where $C_nH_mO_k$ stands for the chemical formula of the resist film. The gaseous products at the right side of the reaction equation (1) diffuse into the atmosphere in the work space 4 and are finally removed from the space 4 through the gate portions 6.

On the other hand, $O_3$ absorbs the deep UV of 1849Å and generates oxygen radicals ($O^*$) having strong chemical activities.

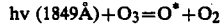

The oxygen radical, $O^*$, reacts with the resist film as follows.

$$O^* + C_nH_mO_k = CO + CO_2 + H_2O \quad (2)$$

The gaseous products in the reaction equation (2) are also removed from the work space 4 through the gate portions 6.

In a negative resist such as CMS, the above oxidation reaction occurs relatively faster at the portion unexposed to the electron beam than at the exposed portion, and thus, the differential removal, i.e. development, of the resist film is achieved.

Figure 3A:
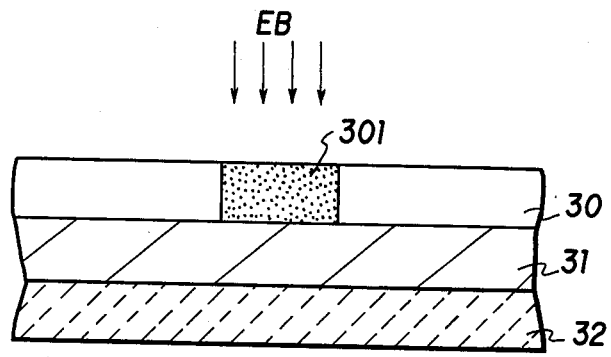
FIGS. 3A to 3C are cross-sectional views illustrating a process of dry development in accordance with the present invention.

A process for a dry development of a resist film in accordance with the present invention will be explained with reference to FIGS. 3A to 3C which are cross-sectional views. Referring to FIG. 3A, an electron beam sensitive negative type resist film 30 is formed on a thin metal layer 31, a chromium layer, for example, which is deposited on a substrate 32 such as glass. A portion 301 of the resist film 30 is selectively exposed to an electron beam EB which causes a cross-linking reaction in the negative type resist film 30. Thus, the portion 301 is rendered to be chemically inactive as compared with the portions not exposed to the electron beam. In other words, an image of a desired pattern is stored as a chemically inactive region in a negative type resist film.

Figure 3B:
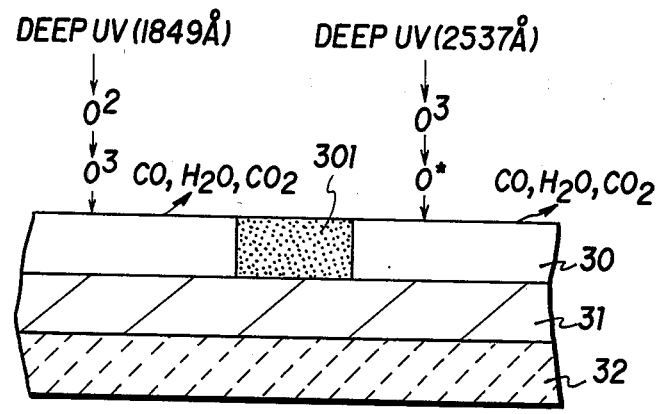
Figure 3C:
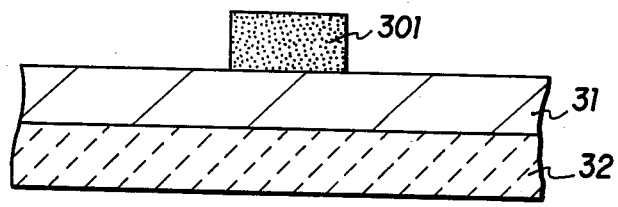

When irradiated by a deep UV of 1849Å or 2537Å in an oxidizing gas such as atmospheric air, the resist film 30 reacts with the ozone $O_3$ or oxygen radicals $O^*$ produced in the oxidizing gas and is removed in the form of gaseous products such as CO, $CO_2$, and $H_2O$, as shown in FIG. 3B, according to the chemical reaction equation (1) or (2). However, the unexposed portions in the resist film 30 are removed faster and thus before the exposed portion 301 is removed, because of the chemical activity difference provided by the electron beam exposure. Thus, the portion 301 is left on the thin metal film 31 as the desired pattern of the resist film 30 as shown in FIG. 3C. The resist pattern is used as the mask in the subsequent etching process of the film 31.

Figure 2:
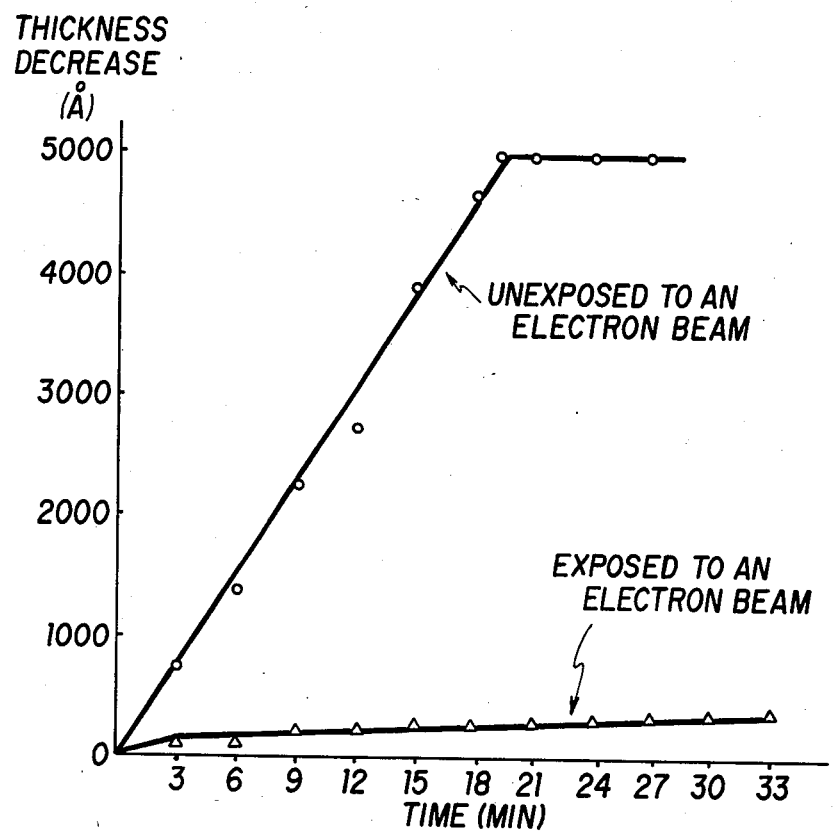
FIG. 2 is a graph showing the relationship between the decrease in thickness and exposure time in a dry development of a CMS resist film.

An experimental result of the dry development of a CMS resist film, which is carried out by using the apparatus as shown in FIG. 1, is presented in FIG. 2 showing the relation between the decrease in thickness and the time of exposure to deep UV of a CMS resist film having respective portions exposed and unexposed to an electron beam. FIG. 2 reveals differential removal rates of about 300Å/min and 12Å/min for the respective portions unexposed and exposed to an electron beam. This means that the dry development of the CMS resist film of 5000Å can be achieved within 16 to 17 minutes and the loss in the thickness of the resist film at the exposed portion is only about 200Å which corresponds to 4% of the initial thickness, 5000Å. In the above example, the substrate is left at room temperature, but if the substrate is raised to 100° C., the film removal rates are about 1.5 times larger.

Referring again to FIG. 1, the substrate 7 on the supporting table 8 is moved to and fro in the transfer direction in the work space 4 by means of the conveyor 9, and thus, uniform development can be attained.

A resist film formed form poly-glycidyl metha-acrylate (PGMA) known as an electron beam resist of negative type can also be developed by using the dry method as described above. The contrast ratio of wet developed PGMA resist films is generally low compared with that of CMS. The experimental result indicates that the low contrast characteristic of PGMA is also maintained in the dry development of the present invention however, the developed PGMA resist film still remains practically usable.

It is obvious that the dry development of the present invention as described above can be applied to the films formed from a certain kind of positive-type electron-beam-sensitive resists including EBR-9 (sold by Toray), because the differential oxidation reaction rates under the deep UV irradiation can also be expected in the positive type resist films.

The present invention may be embodied in other specific forms without departing from the spirit or essential characteristics thereof. The presently disclosed embodiments are therefore to be considered in all respects as illustrative and not restrictive, the scope of the invention being indicated by the appended claims, rather than the foregoing description, and all changes which come within the meaning and range of equivalency of the claims are, therefore, to be embraced therein.

I claim:

1. A dry development method for a resist film, comprising the steps of:
    forming a negative type resist film on a substrate, said resist film being sensitive to an electron beam;
    selectively exposing said resist film to said electron beam such that a latent image of a desired pattern is formed therein, and wherein the portion of the resist film irradiated by the electron beam has a lower etching rate than that of the unexposed portion wqhen subjected to deep ultraviolet radiation; and
    irradiating deep ultraviolet radiation on said resist film in an oxidizing gas at substantially atmospheric pressure, after said resist film has been selectively exposed to said electron beam, whereby a portion of said resist film not exposed to said electron beam is removed to form said desired pattern therein corresponding to said latent image.

2. A dry development method as set forth in claim 1, wherein said deep ultra-violet radiation has a spectral component of 2537Å or shorter wave-length.

3. A dry development method as set forth in claim 2, wherein said deep ultra-violet radiation has a spectral component at 1849Å.

4. A dry development method as set forth in claim 1, wherein said oxidizing gas contains oxygen.

5. A dry development method as set forth in claim 1, wherein said oxidizing gas is atmospheric air.

6. A dry development method as set forth in claim 1, wherein said resist film is formed to have a thickness larger than 1000Å.

7. A dry development method for a resist film, comprising steps of:
    forming a resist film on a substrate, said resist film being sensitive to an electron beam;
    selectively exposing said resist film to said electron beam such that a latent image of a desired pattern is formed therein;
    irradiating deep ulta-violet radiation on said resist film in an oxidizing gas at substantially atmospheric pressure, after said resist film has been selectively exposed to said electron beam, whereby a portion of said resist film not exposed to said electron beam is reoved to form said desired pattern therein corresponding to asid latent image; and
    wherein said resist film is a negative type resist film and comprises a chloro-methyl polystyrene.

8. A dry development method as set forth in claim 7, wherein said deep ultra-violet radiation has a spectral component of 2537A or shorter wave-length.

9. A dry development method as set forth in claim 8, wherein said deep ultra-violet radiation has a spectral component at 1849A.

* * * * *